(12) United States Patent
Nguyen et al.

(10) Patent No.: US 6,624,507 B1
(45) Date of Patent: Sep. 23, 2003

(54) MINIATURE SEMICONDUCTOR PACKAGE FOR OPTO-ELECTRONIC DEVICES

(75) Inventors: Luu Thanh Nguyen, Sunnyvale, CA (US); Ken Pham, San Jose, CA (US); Peter Deane, Los Altos, CA (US); William P. Mazotti, San Martin, CA (US); Bruce C. Roberts, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/922,358

(22) Filed: Aug. 3, 2001

Related U.S. Application Data

(63) Continuation-in-part of application No. 09/568,558, filed on May 9, 2000, and a continuation-in-part of application No. 09/713,367, filed on Nov. 14, 2000.

(51) Int. Cl.⁷ .............................................. H01L 23/02
(52) U.S. Cl. ....................................... 257/686; 257/777
(58) Field of Search ................................. 257/686, 777, 257/778, 723

(56) References Cited

U.S. PATENT DOCUMENTS

| | | | |
|---|---|---|---|
| 5,011,246 A | 4/1991 | Corradetti et al. | |
| 5,019,673 A | 5/1991 | Juskey et al. | |
| 5,139,969 A | 8/1992 | Mori | |
| 5,352,926 A | 10/1994 | Andrews | |
| 5,487,124 A | 1/1996 | Bowen et al. | |
| 5,579,208 A | 11/1996 | Honda et al. | |
| 5,608,262 A | 3/1997 | Degani et al. | |
| 5,723,369 A | 3/1998 | Barber | |
| 5,726,079 A | 3/1998 | Johnson | |
| 5,744,827 A * | 4/1998 | Jeong et al. | 257/686 |
| 5,790,384 A | 8/1998 | Ahmad et al. | |
| 5,798,567 A | 8/1998 | Kelly et al. | |
| 5,821,615 A * | 10/1998 | Lee | 257/686 |
| 5,949,135 A | 9/1999 | Washida et al. | |
| 6,043,430 A | 3/2000 | Chun | |
| 6,054,759 A * | 4/2000 | Nakamura | 257/691 |
| 6,075,284 A * | 6/2000 | Choi et al. | 257/676 |
| 6,201,704 B1 | 3/2001 | Poplawski et al. | |
| 6,236,109 B1 | 5/2001 | Hsuan et al. | |
| 6,258,630 B1 | 7/2001 | Kawahara | |
| 6,281,568 B1 * | 8/2001 | Glenn et al. | 257/684 |
| 6,305,848 B1 | 10/2001 | Gregory | |
| 6,316,837 B1 | 11/2001 | Song | |
| 6,316,838 B1 | 11/2001 | Ozawa et al. | |
| 6,318,909 B1 | 11/2001 | Giboney et al. | |
| 2001/0013645 A1 | 8/2001 | King et al. | |
| 2001/0048151 A1 * | 12/2001 | Chun | 257/686 |

FOREIGN PATENT DOCUMENTS

| | | |
|---|---|---|
| JP | 60-202956 | 10/1985 |
| JP | 08-125066 | 5/1996 |

OTHER PUBLICATIONS

S. Savastiouk, PH.D., et al. "3–D stacked wafer–level packaging", Mar. 2000, *Advanced Packaging*, pp. 28–34.
National Semiconductor, "Packaging Databook", *1993 National Semiconductor*, pp. v–xi to 1–3 to 1–4, 3–1 to 3–20, 3–30 to 3–31, 3–62 to 3–69. Please note: The year of publication is sufficiently earlier than the effective U.S. filing date so that the particular month of publication is not in issue.

* cited by examiner

Primary Examiner—Phat X. Cao
(74) Attorney, Agent, or Firm—Beyer, Weaver & Thomas, LLP.

(57) ABSTRACT

The present invention pertains to using a leadless leadframe package as the semiconductor device package component of an opto-electronic combinational device. Leadless leadframe packages (LLPs) have very small form factors that allow an opto-electronic device to also have a small overall form factor.

19 Claims, 5 Drawing Sheets

MINIATURE SEMICONDUCTOR PACKAGE FOR OPTO-ELECTRONIC DEVICES

CROSS-REFERENCE TO RELATED APPLICATIONS

This application is a continuation-in-part of U.S. patent application Ser. No. 09/568,558 filed on May 9, 2000, entitled "ARRAYABLE, SCALEABLE AND STACKABLE MOLDED PACKAGE CONFIGURATION," and U.S. patent application Ser. No. 09/713,367, filed on Nov. 14, 2000, entitled "MINIATURE OPTO-ELECTRONIC TRANSCEIVER," both of which are hereby incorporated by reference.

This application is related to U.S. patent application No. Ser. 09/947,210, filed Sept. 4, 2001, and entitled "TECHNIQUES FOR JOINING AN OPTO-ELECTRONIC MODULE TO A SEMICONDUCTOR PACKAGE," the content of which is hereby incorporated by reference.

FIELD OF THE INVENTION

The present invention relates generally to opto-electronic devices, and more specifically to the use of leadless leadframe packages with opto-electronic devices.

BACKGROUND OF THE INVENTION

Most computer and communication networks today rely on copper wiring to transmit data between nodes in the network. Since the data transmitted over the copper wire and the data processed within the nodes are both represented in the form of electrical signals, the transfer of data at the node-copper wire interface is straight forward. Other than perhaps a level shift and signal amplification, no other signal processing is required for data transmitted over the copper wire to be decoded by the node. The drawback with using copper wire is its relatively low bandwidth. Copper's ability to transmit data is significantly limited compared to other mediums, such as fiber optics. Accordingly much of the computer and communication networks being built today, including the Internet, are using fiber optic cabling instead of copper wire With fiber optic cabling, data is transmitted using light signals, not electrical signals. For example, a logical one may be represented by a light pulse of a specific duration and a logical zero may be represented by the absence of a light pulse for the same duration. In addition, it is also possible to transmit at the same time multiple colors of light over a single strand of optic fiber, with each color of light representing a distinct data stream. Since light is attenuated less in fiber than electrons traveling through copper, and multiple data streams can be transmitted at one time, the bandwidth of optic fiber is significantly greater than copper.

While fiber optic cabling is very efficient for transferring data, the use of light signals to process data is still very difficult. Data is typically transferred and stored in various locations before, during and after it is operated on in a computer. There still is no efficient way to "store" light signals representative of data. Networks will therefore likely continue using fiber optics for transmitting data between nodes and silicon chips to process the data within the nodes for the foreseeable future. The interface between the fiber optic cable and the nodes that process the data is therefore problematic because signals need to be converted between the electrical and the light domains.

Fiber optic transceivers, which convert light signals from a fiber optic cable into electrical signals, and vice versa, are used as the interface between a fiber optic line and a computer node. A typical transceiver includes a substrate, grooves etched in the substrate to receive the individual fiber optic strands, one or more semiconductor devices mounted on the substrate, one or more discrete optical detectors for converting light signals received over the fiber optic cables into electrical signals, one or more discrete optical emitters for converting electrical signals from the semiconductor devices into light signals. A number of fiber optic transceivers are commercially available from Hewlett Packard, AMP, Sumitomo, Nortel, and Siemens. The problem with all of these fiber optic transceivers is that they are expensive and difficult to fabricate. With each transceiver, the semiconductor devices, emitters, and optical detectors have to be individually mounted onto the substrate, which is a costly and time-consuming process. This limits the applications in which optical interconnects could be substituted for traditional copper usage. Furthermore, the use of discrete emitters and optical detectors adversely affects the performance of the transceiver because electrical parasitics between discrete components are sources of electrical attenuation of inter-chip signals at Gigabit per second speeds that are generally used with such transceivers, more power is consumed for driving these traces than would be needed for an integrated device. The form factor of the on-board optical transceiver is relatively large and therefore does not facilitate inter-board and chip-to-chip optical interconnectability. Also, current opto-electronic packages have relatively large form factors.

A low cost semiconductor device that has a small form factor and that provides a true die to external fiber optic connection is therefore needed.

BRIEF SUMMARY OF THE INVENTION

The present invention pertains to using a leadless leadframe package as the semiconductor device package component of an opto-electronic combinational device. Leadless leadframe packages (LLPs) have very small form factors that allow an opto-electronic device to also have a small overall form factor. An opto-electronic device according to one embodiment of the present invention includes a leadless leadframe semiconductor device package having electrical contact surfaces located on the top surface of the leadless leadframe semiconductor device package, and an optical subassembly that has at least one light emitting device and at least one optical detector. The optical subassembly is positioned on the top surface of the semiconductor device package such that the light emitting device and the optical detector are electrically connected to the electrical contact surfaces of the semiconductor package. In alternative embodiments of the present invention, the leadless leadframe semiconductor device package contains more than one semiconductor die. The leadless leadframe package concept can be used in opto-electronic devices that can serve as transceivers, transmitters, or receivers.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to using a leadless leadframe package as the semiconductor device package component of an opto-electronic module. An opto-electronic module is the combination of an optical and a semiconductor device. Leadless leadframe packages (LLPs) have very small form factors that allow an opto-electronic module to also have a small overall form factor.

Figure 1A:
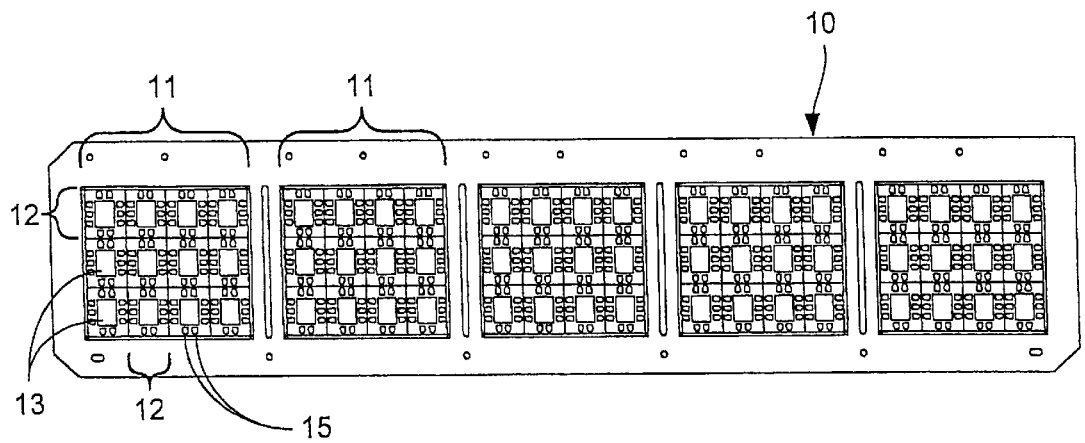
FIG. 1A is a top plan view of a conventional lead frame strip suitable for use in forming leadless leadframe packages.
Figure 1B:
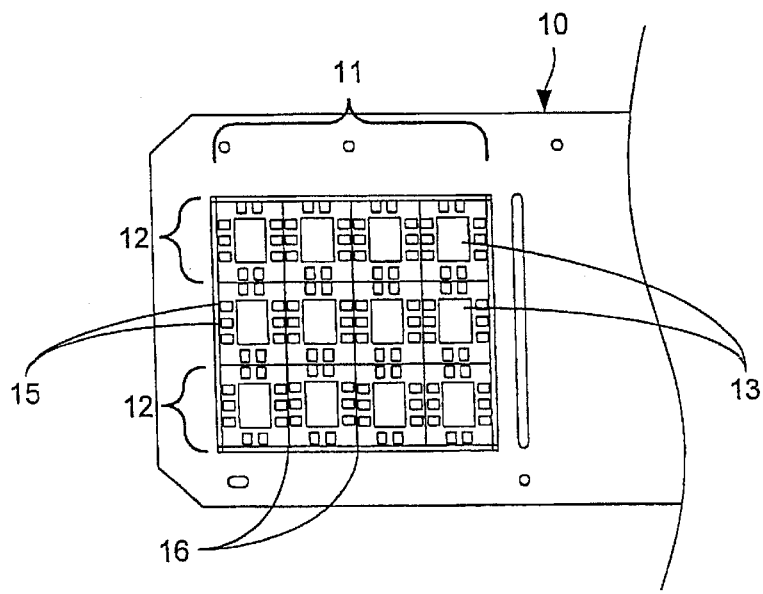
FIG. 1B is an enlarged top plan view of one end of the lead frame strip of FIG. 1A, illustrating one array of device areas.

A leadless leadframe package (LLP) contemplates the use of a metal (typically copper) substrate in the formation of a chip scale package (CSP). As illustrated in FIGS. 1A and 1B, in typical leadless leadframe packages, a copper leadframe strip or panel 10 is patterned to define a plurality of arrays or matrixes 11 of semiconductor device areas 12. Each device area 12 includes a die attach pad 13 and a plurality of contacts 15 disposed about their associated die attach pad 13. Very fine tie bars 16 are used to support the die attach pads 13 and contacts 15.

Figure 2:
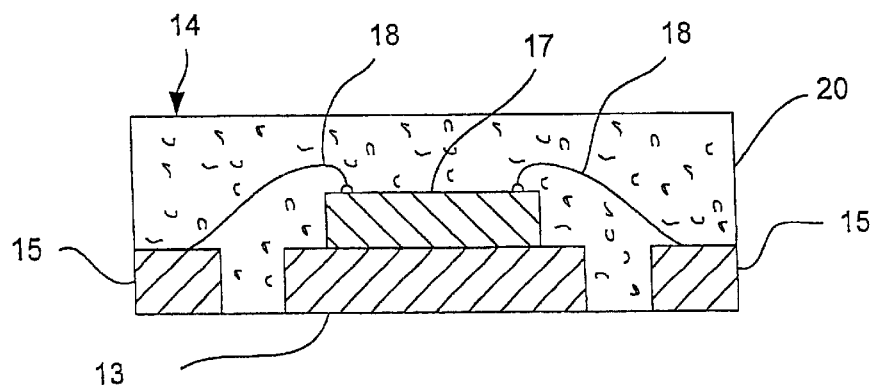
FIG. 2 is a cross-sectional side view of a conventional leadless leadframe package.

FIG. 2 illustrates a cross-sectional view of a typical resulting leadless leadframe package 14. The die attach pad 13 supports a die 17 which is electrically connected to its associated contacts 15 by bonding wires 18. A molded cap 20 encapsulates the die 17 and bonding wires 18, and fills the gaps between the die attach pad 13 and the contacts 15 thereby serving to hold the contacts 15 in place. It should be appreciated that during singulation of the individual packages 14, the tie bars 16 are cut and therefore the only materials holding the contacts 15 in place is the molding material. The resulting packaged chip can then be surface mounted on a printed circuit board or other substrate using conventional surface mount board assembly techniques.

Figure 3A:
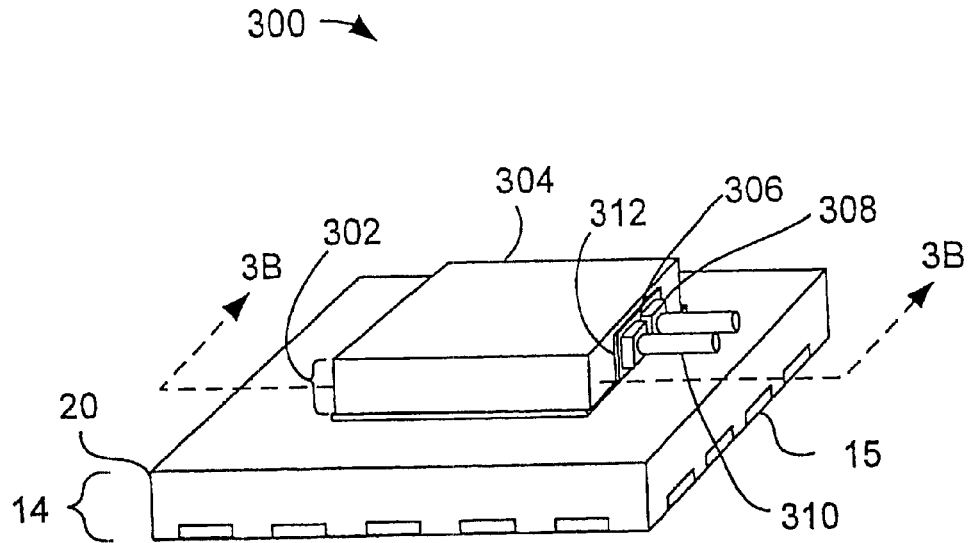
FIG. 3A illustrates a perspective view of an opto-electronic device according to one embodiment of the present invention.
Figure 3B:
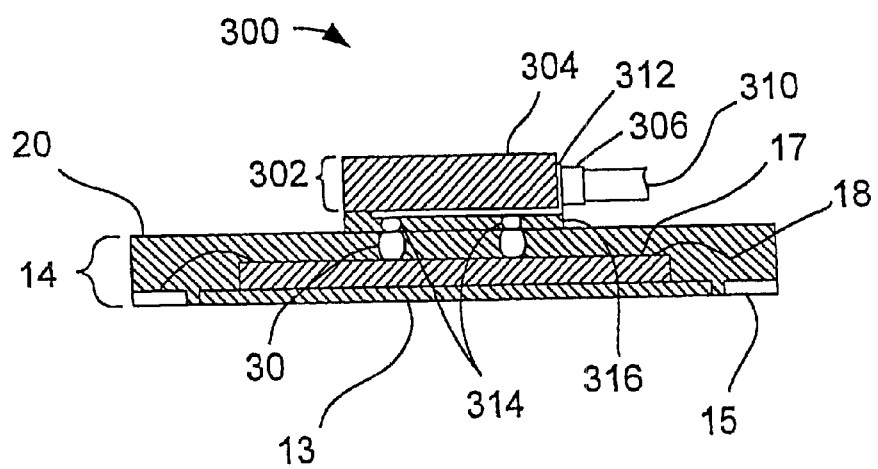
FIG. 3B illustrates the opto-electronic device of FIG. 3A in a side plan cross-sectional a view.

FIG. 3A illustrates a perspective view of an opto-electronic device 300 according to one embodiment of the present invention. Opto-electronic device 300 includes an optical subassembly (OSA) device 302 that is mounted on top of a leadless leadframe semiconductor device package 14. FIG. 3B illustrates the opto-electronic device 300 of FIG. 3A in a side plan cross-sectional view. LLP 14 includes a die attach pad 13, which supports a semiconductor die 17. The semiconductor die 17 is wirebonded such that wires 18 connect the contact landings (not shown) of the die 17 to the electrical contacts 15. In addition, LLP 14 has up-linking electrical pathways 30 that are connected to electrical contact landings on the top surface of the die 17. The up-linking pathways 30 are exposed through the top surface of the molded cap 20. The up-linking pathways 30 provide the electrical connection between the die 17 and the OSA 302. Typically, up-linking pathways 30 are formed of solder ball material formations. However, various conductive materials can also be used.

The embodiment of the OSA 302 in FIGS. 3A and 3B shows that the OSA 302 has a body 304, an emitter 306 and an optical detector 308, and optical fibers 310. The body 304 can be formed of plastic or any other material that is light in weight and suitable for supporting emitters and detectors. Desirable properties for the body 304 are thermal stability, low coefficient of thermal expansion, and manufacturability with high precision. The emitter 306 and the detector 308 are commonly known devices used to send and receive light signals, respectively, that pass through the fibers 310. The emitter 306 and the detector 308 are each electrically connected to a flexible circuitry tape 312, which is a flexible tape with embedded circuitry traces. The flexible circuitry tape 312 wraps around the side and the bottom surface of the OSA 302 so that the emitter 306 and the detector 308 can be connected to the die 17. 48; The circuit traces on the tape 312 are connected to the up-linking pathways 30 through conductive solder balls 314. Conductive solder balls 314 provide electrical pathways and a method to bond the OSA 302 to the LLP 14. To strengthen the bond between the OSA 302 and the LLP 14, underfill material 316 is injected into the standoff gap between the OSA 302 and the LLP 14. Underfill material 316 also provides a pathway for heat dissipation between the OSA 302 and the LLP 14. Note that in another embodiment, body 304 and the flexible circuitry tape 312 can be integrated into one functional unit, which can be made out either of precision injection molded ceramics or filled thermosets, followed by patterning and metalization.

Alternative techniques can also be used to connect the OSA 302 to the LLP 14. For further description as to these techniques, refer to U.S. patent application No. Ser. 09/947, 210, which is hereby incorporated by reference.

The use of LLP's is advantageous because the opto-electronic device can be manufactured for different applications. This can be done by using LLP's with different numbers of electrical contacts 15. In some embodiments, the range of electrical contacts 15 can vary from 44 to 50 to 52, and any number in between. In other embodiments the number of electrical contacts 15 can either be less than 44 or more than 52.

In some embodiments, the opto-electronic package of the present invention are used for 10 Gbps transceiver applications. These embodiments can be extended to 40 to 100 Gbps WDM (Wavelength Division Multiplexing) applications.

The die attach pad 13 that is exposed on the undersurface of the LLP 14 facilitates thermal conductivity from the LLP 14 to, for instance, a printed circuit board to which the LLP is connected. For instance, heat can be channeled directly from the package to the ground plane or copper core used in typical motherboards. No external sinks or other devices are needed for thermal dissipation. In some embodiments of the LLP 14, a die attach pad is not included so that the die 17 is exposed on the bottom surface of the LLP 14. In this case, heat from the die 17 can travel directly to a printed circuit board without passing through a die attach pad.

The LLP 14 can be attached to a printed circuit board by placing solder on the electrical contacts 15 and the die attach pad 13. The solder material allows for heat to travel from the electrical contacts 15 and the die attach pad 13 to the printed circuit board. For example, heat can be channeled directly from the package to the ground plane or copper core used in typical motherboards. Due to the surface tension of the solder material, self-alignment during the reflow process for the solder material aids the alignment of the opto-electronic device onto a printed circuit board. This is advantageous because less sophisticated alignment mechanisms are required to ensure the proper positioning of the opto-electronic devices on a printed circuit board, resulting in lower manufacturing costs.

LLP implementation in opto-electronic packages is advantageous because the size of the opto-electronic package can be reduced. In some embodiments, the size of LLPs are approximately 0.9 mm +/−0.1 mm in height and 7×7, 9×9.5, and 9.5×9.5 mm for the 44L, 50L, and 52L LLP designs, respectively. The small form factor of the LLPs allows a high number of the opto-electronic packages to be placed next to each other so that a high launch density can be achieved. A high launch density means that a high number of optical devices can be placed within a given amount of space on a printed circuit board. The small form factor of the opto-electronic device also allows for a transceiver device to contain multiple lasers and detectors such that a multiple channel transceiver can be formed.

Figure 4A:
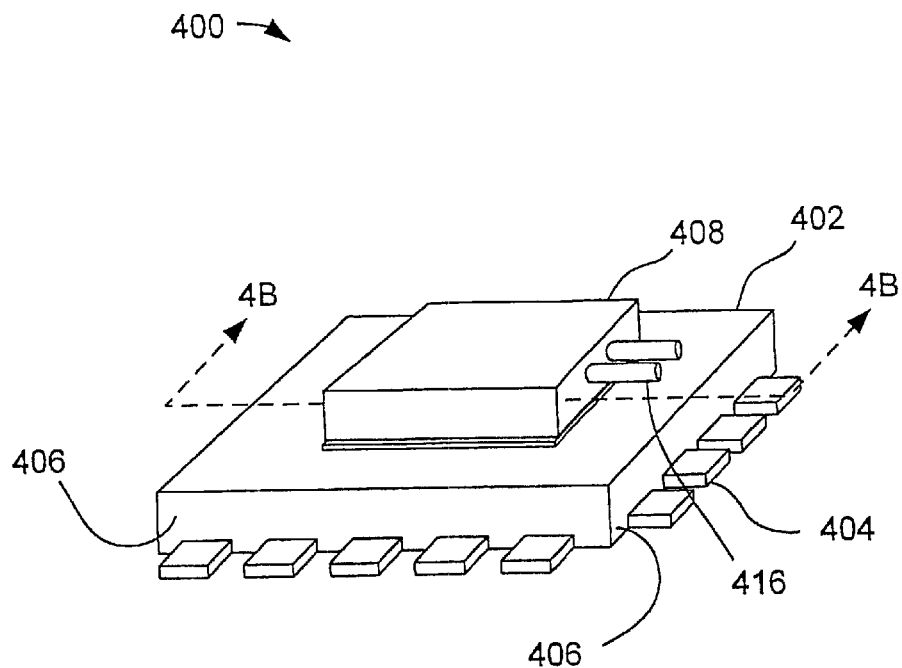
FIG. 4A illustrates an opto-electronic device according to an alternative embodiment of the present invention.

FIG. 4A illustrates an opto-electronic device 400 according to an alternative embodiment of the present invention. The device 400 has an LLP 402 that has electrical contacts 404 that are elongated so that they extend beyond the side surfaces 406 of the LLP 402. The elongated electrical contacts 406 are useful in that they can be simultaneously pressed onto a printed circuit board as a method for attaching the opto-electronic device 400. For example, a hot-bar press machine can simultaneously press the elongated contacts 404 along an edge of the LLP 402. The hot-bar press can also be shaped to simultaneously press the elongated contacts 404 on more than one edge of the LLP 402.

Hot-bar pressing the elongated contacts 404 is a very fast way to attach the opto-electronic device onto a circuit board. Also, since the entire opto-electronic package does not undergo a heating process, for example, as required when curing a solder attachment as shown in FIG. 3B, the device is not put to the risk of heat damage. Typically, when hot-bar pressing, the die attach pad is bonded to the motherboard with thermally conductive, highly filled epoxy.

Figure 4B:
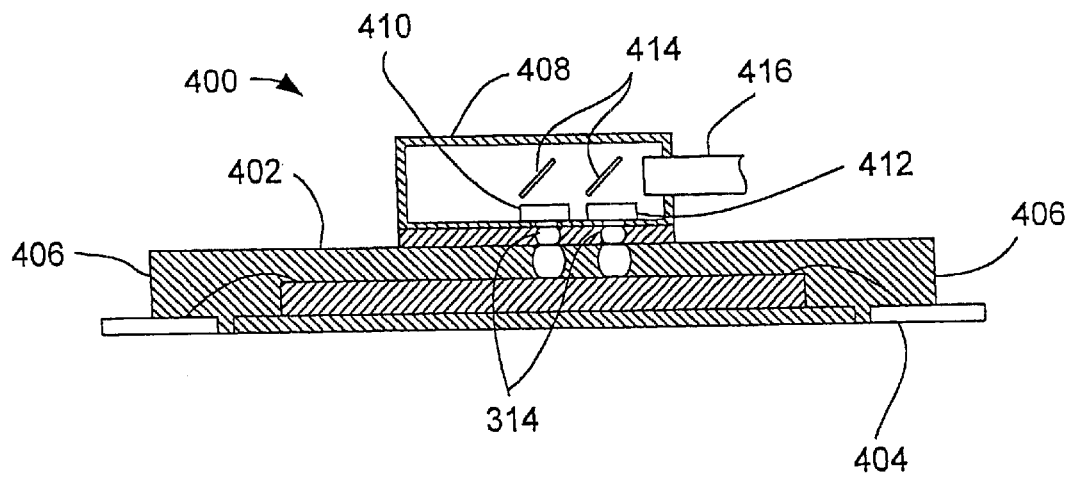
FIG. 4B illustrates the opto-electronic device of FIG. 4A along line 4B–4B.

FIGS. 4A and 4B illustrate a different embodiment of an OSA 408 where a flexible circuit tape as shown in FIGS. 3A and 3B is not used. In this case, an emitter 410 and an optical detector 412 are located on the bottom surface of the OSA 408. Mirrors 414 are positioned to reflect light signals to and from the optical fibers 416. The emitter 410 and the detector 412 are connected through the bottom of the OSA 408 to the solder balls 314.

Figure 7:
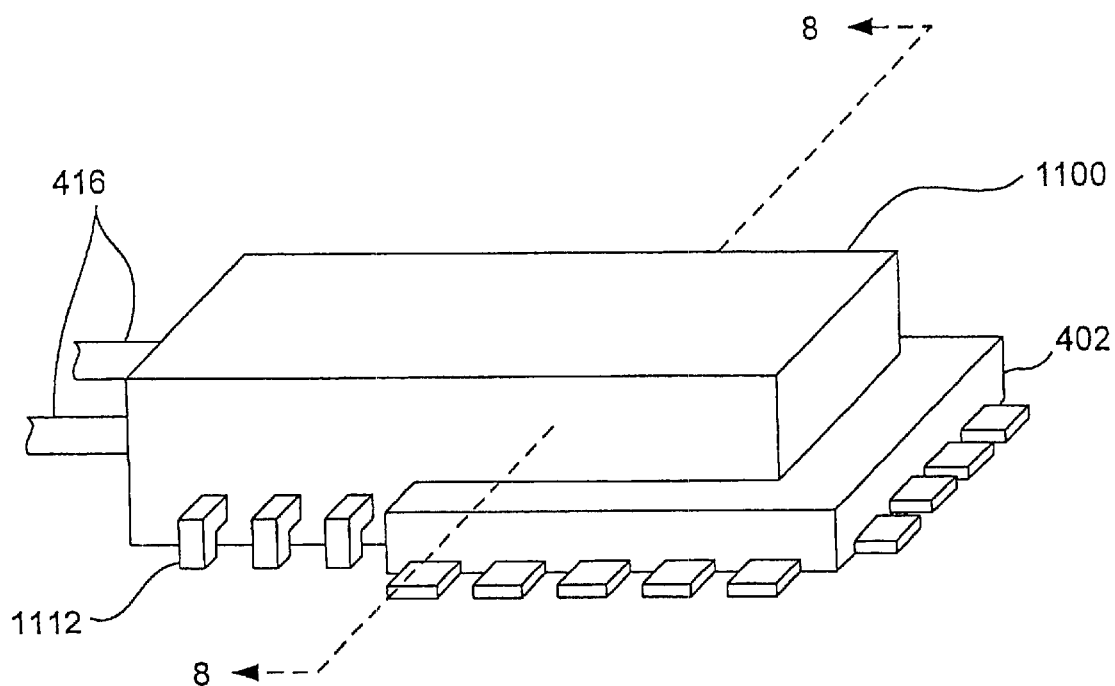
FIG. 7 illustrates a perspective view of an opto-electronic device placed within a sleeve device according to one embodiment of the present invention.
Figure 8:
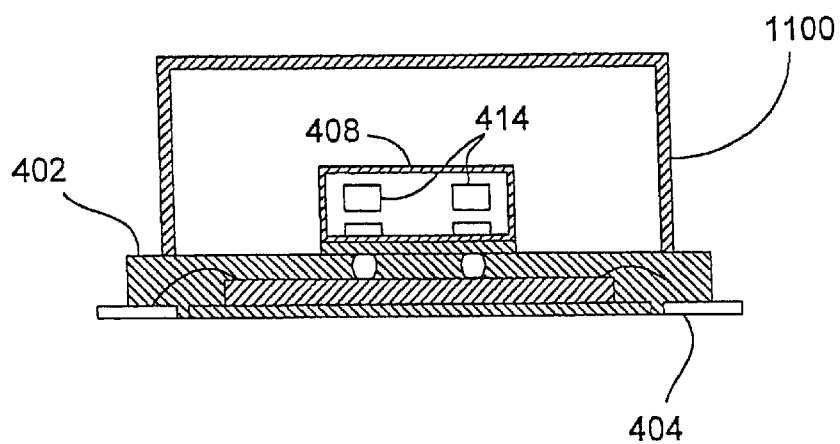
FIG. 8 illustrates a cross-sectional view of the opto-electronic device of FIG. 7 along line 8—8.

FIGS. 7 illustrates a perspective view of an opto-electronic device 400 placed within a sleeve device 1100 according to one embodiment of the present invention. FIG. 8 illustrates a cross-sectional view of the opto-electronic device 400 along line 8–8. Sleeve device 1100 serves to strengthen the connection between the optical fiber 416, the OSA 408 and the LLP 402. Since three edges of the LLP 402 extend from the edges of the sleeve device 1100, a hotbar press along the three exposed edges can be performed to secure the opto-electronic device 400 to a printed circuit board. The stems 1112 of the sleeve device 1100 are also secured to the printed circuit board to further strengthen the connection between the opto-electronic device and the printed circuit board. For further description as to the sleeve device 1100, refer to the U.S. patent application No. Ser. 09/713,367 which has been incorporated by reference herein.

Long lead lengths allow for wire bonding of small dies within the large pad. The option of using a polyimide ring to maintain lead co-planarity for handling and wirebonding is possible.

Figure 5:
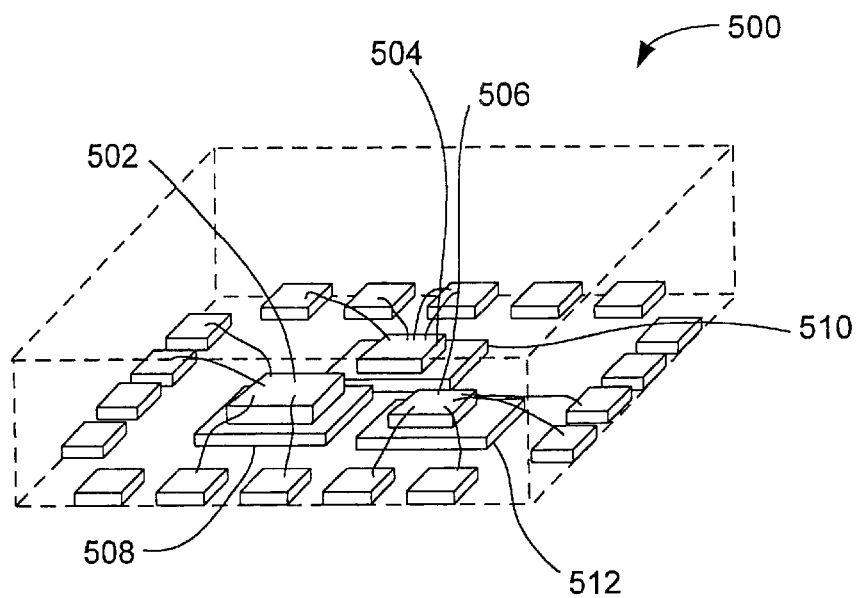
FIG. 5 illustrates a perspective view of an alternative embodiment of an LLP that is used as part of an opto-electronic device where the LLP contains more than one semiconductor die.

FIG. 5 illustrates a perspective view an alternative embodiment of an LLP 500 that is used as part of an opto-electronic device. LLP 500 contains multiple semiconductor dice 502, 504 and 506. The electrical pathways connected to each of the dice 502, 504 and 506 and leading to the top surface of the LLP package are not shown to more clearly show the dice. Also for clarity sake, only a dashed line representation of the molded cap of the LLP 500 is shown. The use of multiple and separate dice is advantageous in that interference, or cross-talk, between the various types of circuitry within one single die can be avoided. For instance, within a single die, the circuitry for the Clock and Data Recovery (CDR) unit, the Serializer/Deserializer unit, the laser driver, and the Trans Impedance Amplifier (TIA) can cause electromagnetic interference that disrupts the other circuitry's performance. However, as in LLP 500, when the separate types of circuitry are embodied within separate die (dices 502, 504 and 506). Each of dice 502, 504 and 506 are spaced apart from each other so to substantially reduce potential cross-talk between the dice. Each of the dice are mounted onto a respective die attach pad 508, 510 and 512 so that each die is electrically isolated from each other. Separation of the circuitry into separate die increases the performance of opto-electronic devices. In alternative embodiments, it is possible to place multiple dice onto a single die attach pad.

Figure 6:
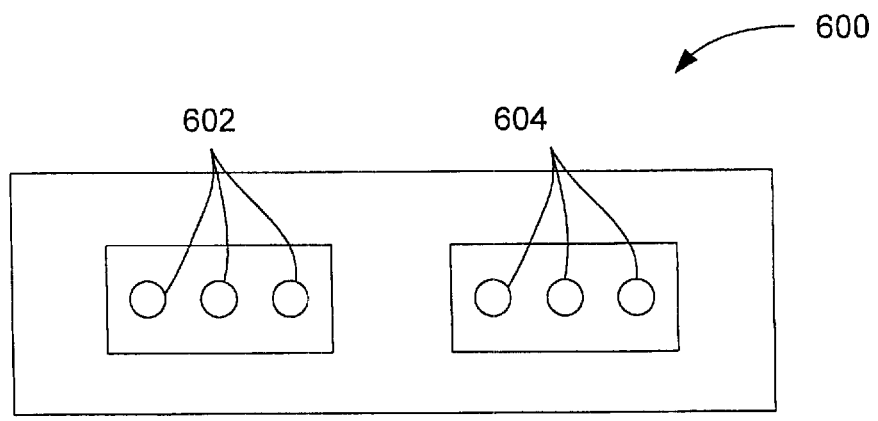
FIG. 6 illustrates a front plan view of an OSA having multiple laser light emitters and multiple detectors.

In LLP 500, die 502 is a CDR, die 504 is a laser driver, and die 506 is a TIA. Various numbers and combinations of die types can be placed within a single LLP package form factor. The number and combination of die will depend upon the specific application requirements. The separation of circuitry into separate die also facilitates the construction of a multiple channel transceiver where a single opto-electronic package contains multiple lasers and multiple detectors. Reduction in cross-talk in such devices is critical since a large number of different circuitry is involved. FIG. 6 illustrates a front plan view of an OSA 600 having multiple laser light emitters 602 and multiple detectors 604. OSA 600 can be joined to an LLP CSA having individual and separated dice as in FIG. 5.

In alternative embodiments of the present invention, the leadless leadframe package can form one of the components of a stacked device package wherein the component device attached to the LLP is other than an optical device. The component device attached to the LLP can be a variety of devices such as semiconductor device packages, wireless transmitters, wireless receivers, wireless transceivers, wireless optical modules (free space optical), as well as other devices. Again, the small form factor of the LLP is advantageous in that it allows the stacked combination of component devices to have a smaller overall form factor. For further detail regarding stacked components, refer to U.S. patent application No. Ser. 09/568,558 filed on May 9, 2000, entitled "ARRAYABLE, SCALEABLE AND STACKABLE MOLDED PACKAGE CONFIGURATION," which is hereby incorporated by reference for all purposes.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. An opto-electronic device comprising:
   a leadless leadframe semiconductor device package having top and bottom surfaces, the semiconductor device package includes a die, a leadframe having a first plurality of electrical contacts that are exposed and substantially co-planar with the bottom surface of the semiconductor device package, and a second plurality of electrical contacts located on the top surface of the leadless leadframe semiconductor device package; and
   an optical subassembly that has at least one light emitting device and at least one optical detector, the optical subassembly being positioned on the top surface of the semiconductor device package such that the light emitting device and the optical detector are electrically connected to the second plurality of electrical contacts of the semiconductor device package.

2. An opto-electronic device as recited in claim 1 wherein at least one of the first plurality of electrical contacts having a portion that extends beyond a peripheral edge of the semiconductor device package.

3. An opto-electronic device as recited in claim 2 wherein a portion of the first plurality of electrical contacts on three peripheral edges of the semiconductor device package extend beyond their respective peripheral edge of the semiconductor device package.

4. An opto-electronic device as recited in claim 2 further comprising:
   a printed circuit board having a plurality of printed circuit board contact pads, wherein the opto-electronic device is attached to the printed circuit board such that the portion of the first plurality of electrical contacts extending beyond the peripheral edge of the semiconductor device is hot-bar pressed onto a respective one of the printed circuit board contact pads.

5. An opto-electronic device as recited in claim 1 wherein the leadless leadframe semiconductor device package contains more than one semiconductor die.

6. An opto-electronic device as recited in claim 5 wherein one of the semiconductor die contains circuitry to perform clock and data recovery functions.

7. A An opto-electronic device as recited in claim 5 wherein one of the semiconductor die contains circuitry to perform serializing and deserializing functions.

8. An opto-electronic device as recited in claim 5 wherein one of the semiconductor die contains circuitry to drive a laser emitter.

9. An opto-electronic device as recited in claim 5 wherein one of the semiconductor die contains circuitry that amplifies electronic signals.

10. An opto-electronic device as recited in claim 5 further comprising:
    a plurality of die attach pads embedded within the leadless leadframe semiconductor device package, each of the die attach pads supporting a respective semiconductor die.

11. An opto-electronic device comprising:
    a leadless leadframe semiconductor device package having electrical contacts located on a top surface of the semiconductor device package;
    an optical subassembly that has at least one light emitting device and at least one optical detector, the optical subassembly being positioned on the top surface of the semiconductor device package; and
    a flexible circuit tape that electrically connects the light emitting device and the optical detector to the electrical contact surfaces of the semiconductor device package, the flexible circuit tape includes flexible tape material having embedded circuit traces, the embedded circuit traces including a first set of the traces wherein each of the traces have a first end connected to the light emitting device and a second end connected to a respective electrical contact and a second set of traces wherein each of the traces have a first end connected to the optical detector and a second end connected to a respective electrical contact.

12. An opto-electronic device as recited in claim 11 wherein the flexible circuit tape is adhered to a side and a bottom surface of the optical subassembly.

13. An opto-electronic device comprising:
    a leadless leadframe semiconductor device package having top and bottom surfaces, the semiconductor device package includes electrical contact surfaces located on the top surface of the semiconductor device package, a die attach pad, and a plurality of electrical contacts exposed through the bottom surface of the semiconductor device package;
    an optical subassembly that has at least one light emitting device and at least one optical detector, the optical subassembly being positioned on the top surface of the semiconductor device package such that the light emitting device and the optical detector are electrically connected to the electrical contact surfaces of the semiconductor package; and
    a printed circuit board having electrically conductive contact pads, wherein the opto-electronic device is attached to the printed circuit board with conductive solder paste that is applied to the bottom surface of the die attach pad and the electrical contacts, whereby heat energy can travel from the leadless leadframe semiconductor device package through the die attach pad to the printed circuit board.

14. An opto-electronic device comprising:
    a leadless leadframe semiconductor device package having electrical contact surfaces located on the top surface of the semiconductor device package and a plurality of electrical contacts exposed through the bottom surface of the semiconductor device package, wherein a portion of the electrical contacts on three peripheral edges of the semiconductor device package extend beyond their respective peripheral edge of the semiconductor device package;

an optical subassembly that has at least one light emitting device and at least one optical detector, the optical subassembly being positioned on the top surface of the semiconductor device package such that the light emitting device and the optical detector are electrically connected to the electrical contact surfaces of the semiconductor package; and an opto-electronic transceiver assembly for connecting an optical fiber to the optical subassembly, the transceiver assembly including a relatively rigid sleeve device having a securing structure adapted to rigidly mount to the semiconductor device package in a manner substantially preventing relative movement therebetween, the three peripheral edges of the semiconductor device package having extended electrical contacts located outside of the sleeve device, the sleeve device defining a socket sized for aligning receipt of the optical fiber therein for optical coupling to the optical subassembly; and a plurality of mounting elements cooperating with the sleeve device to mount the sleeve device and the semiconductor package to a printed circuit board, as a unit.

15. An opto-electronic device as recited in claim 14 further comprising:

a printed circuit board having a plurality of printed circuit board contact pads, wherein the opto-electronic device is attached to the printed circuit board such that the portions of the electrical contacts extending beyond the peripheral edges of the semiconductor device are hot-bar pressed onto a respective one of the printed circuit board contact pads.

16. An opto-electronic device comprising:

a leadless leadframe semiconductor device package having electrical contact surfaces located on the top surface of the semiconductor device package and more than one semiconductor die;

an optical subassembly that has a light emitting device and an optical detector, the optical subassembly being positioned on the top surface of the semiconductor device package; and a flexible circuit tape that electrically connects the light emitting device and the optical detector to the electrical contact surfaces of the semiconductor device package, the flexible circuit tape includes flexible tape material having embedded circuit traces, the embedded circuit traces including a first set of the traces wherein each of the traces have a first end connected to the light emitting device and a second end connected to a respective electrical contact surface and a second set of traces wherein each of the traces have a first end connected to the optical detector and a second end connected to a respective electrical contact surface.

17. An opto-electronic device as recited in claim 16 wherein the flexible circuit tape is adhered to a side and a bottom surface of the optical subassembly.

18. An opto-electronic device comprising:

a leadless leadframe semiconductor device package having top and bottom surfaces, the semiconductor device package includes a die, a leadframe having a first plurality of electrical contacts that are exposed and substantially co-planar with the bottom surface of the semiconductor device package, and a second plurality of electrical contacts located on the top surface of the leadless leadframe semiconductor device package; and an optical subassembly that has at least one photonic device, the optical subassembly being positioned on the top surface of the semiconductor device package such that the photonic device is electrically connected to the second plurality of electrical contacts of the semiconductor package.

19. An opto-electronic device comprising:

a semiconductor device package having top and bottom surfaces, a first set of electrical contacts located on the top surface of the semiconductor device package and a second set of electrical contacts not located on the top surface of the semiconductor device package;

an optical subassembly that has at least one photonic device, the optical subassembly being positioned on the top surface of the semiconductor device package; and a flexible circuit tape that wraps around the optical subassembly and electrically connects on different sides of the optical subassembly the photonic device to at least some of the first set of electrical contacts of the semiconductor device package.

* * * * *